United States Patent
Fujimori et al.

(10) Patent No.: US 7,496,133 B2
(45) Date of Patent: Feb. 24, 2009

(54) MULTI-RATE ON-CHIP OCN FILTER FOR A TRANSCEIVER SYSTEM

(75) Inventors: Ichiro Fujimori, Irvine, CA (US); Mario Caresosa, Rancho Santa Margarita, CA (US); Namik Kocaman, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 1191 days.

(21) Appl. No.: 10/299,892

(22) Filed: Nov. 19, 2002

(65) Prior Publication Data
US 2004/0105410 A1 Jun. 3, 2004

Related U.S. Application Data

(60) Provisional application No. 60/423,070, filed on Nov. 1, 2002, provisional application No. 60/423,166, filed on Nov. 1, 2002, provisional application No. 60/423,294, filed on Nov. 1, 2002, provisional application No. 60/423,071, filed on Nov. 1, 2002, provisional application No. 60/423,072, filed on Nov. 1, 2002, provisional application No. 60/423,074, filed on Nov. 1, 2002, provisional application No. 60/423,034, filed on Nov. 1, 2002.

(51) Int. Cl.
H04B 1/38 (2006.01)
(52) U.S. Cl. ................................................... 375/219
(58) Field of Classification Search ................. 375/219, 375/220, 254, 278, 284, 285, 345, 346, 350, 375/229–236; 398/149, 159, 213; 307/15; 324/714; 363/62
See application file for complete search history.

(56) References Cited

U.S. PATENT DOCUMENTS

| | | | | | |
|---|---|---|---|---|---|
| 3,890,577 | A | * | 6/1975 | Grundy | 330/302 |
| 5,557,243 | A | * | 9/1996 | Ho | 331/158 |
| 5,949,203 | A | * | 9/1999 | Buthker | 318/254 |
| 5,978,742 | A | * | 11/1999 | Pickerd | 702/66 |
| 6,351,509 | B1 | * | 2/2002 | Vitenberg et al. | 375/377 |
| 2002/0039211 | A1 | * | 4/2002 | Shen et al. | 359/110 |
| 2002/0044598 | A1 | * | 4/2002 | Frenkel et al. | 375/232 |
| 2002/0167703 | A1 | * | 11/2002 | Merritt | 359/173 |
| 2003/0043897 | A1 | * | 3/2003 | Papanikolaou et al. | 375/229 |
| 2003/0067642 | A1 | * | 4/2003 | Svenson et al. | 359/111 |

* cited by examiner

Primary Examiner—Sam K Ahn
(74) Attorney, Agent, or Firm—McAndrews, Held & Malloy, Ltd.

(57) ABSTRACT

An apparatus and method are disclosed to aid a transceiver chip, in a wide-band serial data communications system, in receiving data at multiple data rates. A multi-rate filter within the transceiver chip is implemented as at least one adjustable-rate filter stage and a limiting stage. The at least one adjustable-rate filter stage is used to generate a filtered serial data signal from a received serial data signal. The limiter stage generates a full-swing serial data signal from the filtered serial data signal. A bandwidth of the at least one adjustable-rate filter stage is adjustable in order to receive serial data signals at multiple data rates. The bandwidth of the multi-rate filter within the transceiver chip is selectable by the user of the wide-band communication system.

26 Claims, 12 Drawing Sheets

MULTI-RATE ON-CHIP OCN FILTER FOR A TRANSCEIVER SYSTEM

CROSS-REFERENCE TO RELATED APPLICATIONS/INCORPORATION BY REFERENCE

Each of the following applications are related to the present application and are incorporated herein by reference in their entirety:

| Ser. No. | Title | Filed | Inventor(s): |
| --- | --- | --- | --- |
| 60/423,070 | Transceiver System and Method Supporting Variable Rates and Multiple Protocols | Nov. 1, 2002 | Vikram Natarajan, Kang Xiao, Mario Caresosa, Jay Proano |
| 60/423,166 | Method and System for a Three Conductor Transceiver Bus | Nov. 1, 2002 | Chenmin Zhang, Steve Thomas, Randall Stolaruk |
| 60/423,294 | System and Method Supporting Auto-Recovery in a Transceiver System | Nov. 1, 2002 | Kang Xiao, Mario Caresosa, Hongtao Jiang, Randall Stolaruk |
| 60/423,071 | Method and System for Synchronizing a Transceiver and a Downstream Device in an Optical Transmission Network | Nov. 1, 2002 | Jay Proano, Sheila Qiu, Tim Chan, Hongtao Jiang |
| 60/423,072 | Transceiver System and Method Supporting Multiple Selectable Voltage | Nov. 1, 2002 | Mario Caresosa, Namik Kocaman |
| 60/423,074 | Configurable Voltage Controlled Oscillator System and Method | Nov. 1, 2002 | Mario Caresosa, Namik Kocaman, Afshin Momtaz |

This application also makes reference to, claims priority to and claims the benefit of U.S. provisional patent application Ser. No. 60/423,034 filed on Nov. 1, 2002.

FEDERALLY SPONSORED RESEARCH OR DEVELOPMENT

[Not Applicable]

SEQUENCE LISTING

[Not Applicable]

MICROFICHE/COPYRIGHT REFERENCE

[Not Applicable]

BACKGROUND OF THE INVENTION

Embodiments of the present invention relate generally to an apparatus and method corresponding to a transceiver chip that is part of an optical serial data communications system, and more particularly to reception, signal conditioning, and filtering of multi-rate serial data signals received by the transceiver chip.

High-speed digital communication networks over copper and optical fiber are used in many network communication and digital storage applications. SONET, Ethernet and Fibre Channel are widely used communication protocols used today and continue to evolve to respond to the increasing need for higher bandwidth in digital communication systems.

The Open Systems Interconnection (OSI) model (ISO standard) was developed to establish standardization for linking heterogeneous computer and communication systems. The OSI model includes seven distinct functional layers including Layer 7: an application layer; Layer 6: a presentation layer; Layer 5: a session layer; Layer 4: a transport layer; Layer 3: a network layer; Layer 2: a data link layer; and Layer 1: a physical layer. Each OSI layer is responsible for establishing what is to be done at that layer of the network but not how to implement it.

Layers 1 to 4 handle network control and data transmission and reception. Layers 5 to 7 handle application issues. Specific functions of each layer may vary to a certain extent, depending on the exact requirements of a given protocol to be implemented for the layer. For example, the Ethernet protocol provides collision detection and carrier sensing in the data link layer.

The physical layer, Layer 1, is responsible for handling all electrical, optical, and mechanical requirements for interfacing to the communication media. The physical layer provides encoding and decoding, synchronization, clock and data recovery, and transmission and reception of bit streams. Typically, high-speed electrical or optical transceivers are the hardware elements used to implement this layer.

The Synchronous Optical Network (SONET) is an interface standard for synchronous optical fiber transmission, applicable to the Physical Layer of the OSI Reference Model.

SONET comprises a set of signal rates for transmitting and receiving serial digital data signals over optical fiber. The base rate (OC-1) is 51.84 Mbps. Multiples of the base rate are also provided. For example:

OC-3 (155.52 Mbps)

OC-6 (311.04 Mbps)

OC-12 (622.08 Mbps)

OC-24 (1.244 Gbps)

OC-48 (2.488 Gbps)

It is desirable to use the same hardware to transmit and receive variable data rates since it is easier to develop and maintain only one system which can handle multiple tasks. In addition, switching and routing functions may be performed dynamically which improves the flexibility of the network.

However, possible problematic situations may occur when driving lower data rate signals into wide-bandwidth components. For example, when OC-3, OC-6, OC-12, or 1 Gigabit Ethernet rate signals are driven into OC-48 optical components, the signals may not be properly filtered.

FIG. 1 is an exemplary illustration of signal ringing that may occur in an eye pattern of a lower rate serial data signal (e.g., a 311 Mbps OC-6 signal) when the lower rate serial data signal passes through a filter stage having a wider bandwidth corresponding to a higher data rate serial data signal (e.g., an OC-48 signal). The filter stage has almost no filtering effect on the OC-6 signal. Ringing, overshoot, and undershoot as a result of impedance mismatches and discontinuities on the signal transmission path imposed on the OC-6 signal pass through the OC-48 filter stage and may result in bit errors.

FIG. 2 is an exemplary illustration of eye pattern corruption that may occur in an eye pattern of a lower rate serial data signal (e.g., an OC-12 signal) when the lower rate serial data signal passes through a wider bandwidth filter stage (e.g., an OC-48 filter stage). The eye pattern is not clean and is beginning to close, which may generate mask violations.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

Certain embodiments of the present invention provide an apparatus and a method to aid a transceiver chip in receiving serial data signals at multiple data rates in a wide-band serial data communications system by filtering out excessive ringing of said serial data signals.

Apparatus of the present invention comprises a multi-rate filter within a transceiver chip implemented as at least one adjustable-rate filter stage and a limiting stage. The at least one adjustable-rate filter stage is used to generate a filtered serial data signal from a received serial data signal. The limiter stage generates a full-swing serial data signal from the filtered serial data signal. A bandwidth of the at least one adjustable-rate filter stage is adjustable in order to receive serial data signals at multiple data rates.

A method of the present invention provides for selecting a bandwidth of a multi-rate filter within a transceiver chip and filtering a received serial data signal, using the multi-rate filter, to generate a filtered serial data signal. The filtered serial data signal passes through a limiter stage within the transceiver chip to generate a full-swing serial data signal.

These and other advantages, aspects and novel features of the present invention, as well as details of an illustrated embodiment thereof, will be more fully understood from the following description and drawings.

DETAILED DESCRIPTION OF THE INVENTION

Figure 1:
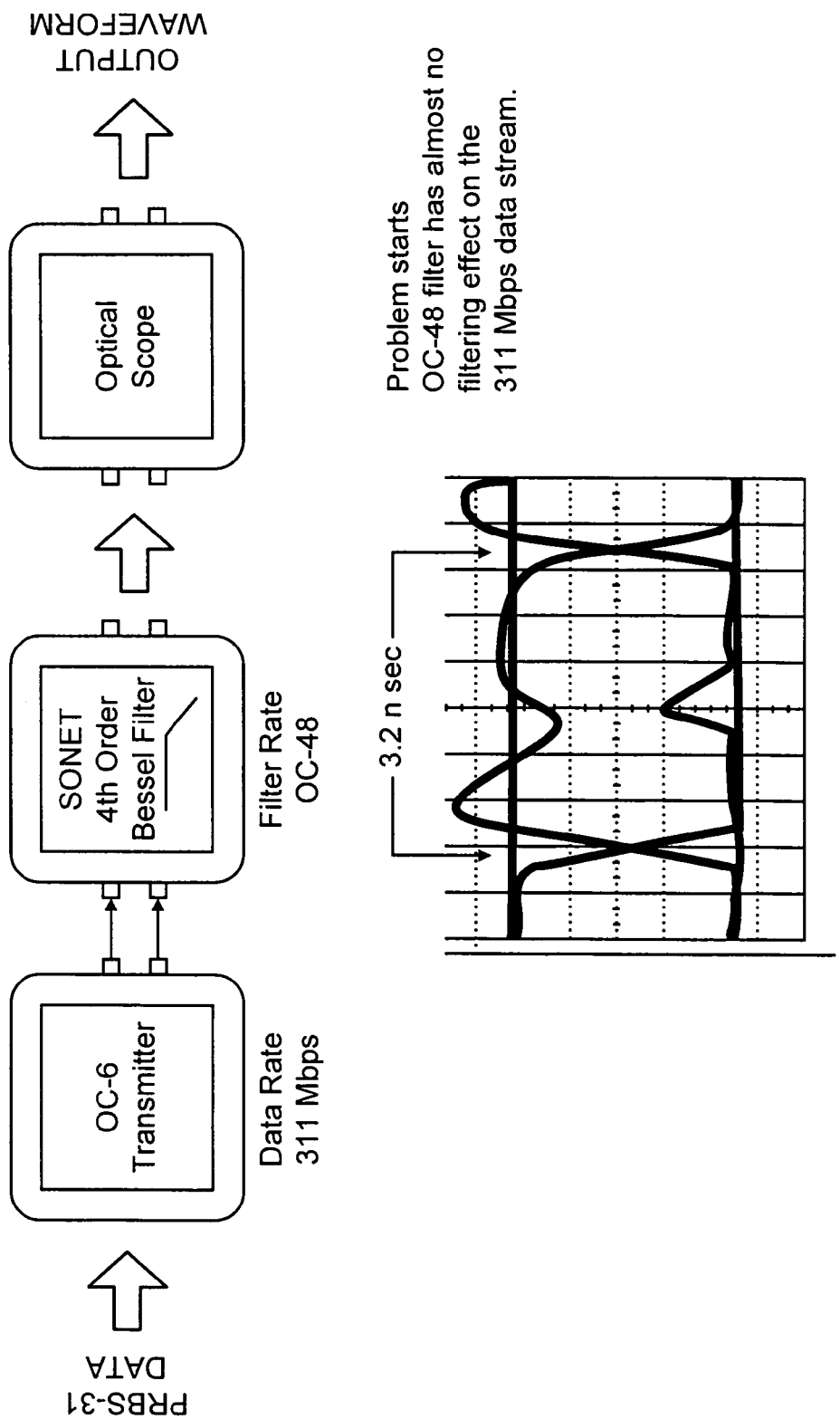
FIG. 1 is an exemplary illustration of signal ringing that may occur in an eye pattern of a lower rate serial data signal when the lower rate serial data signal passes through a relatively wide-band filter stage.
Figure 2:
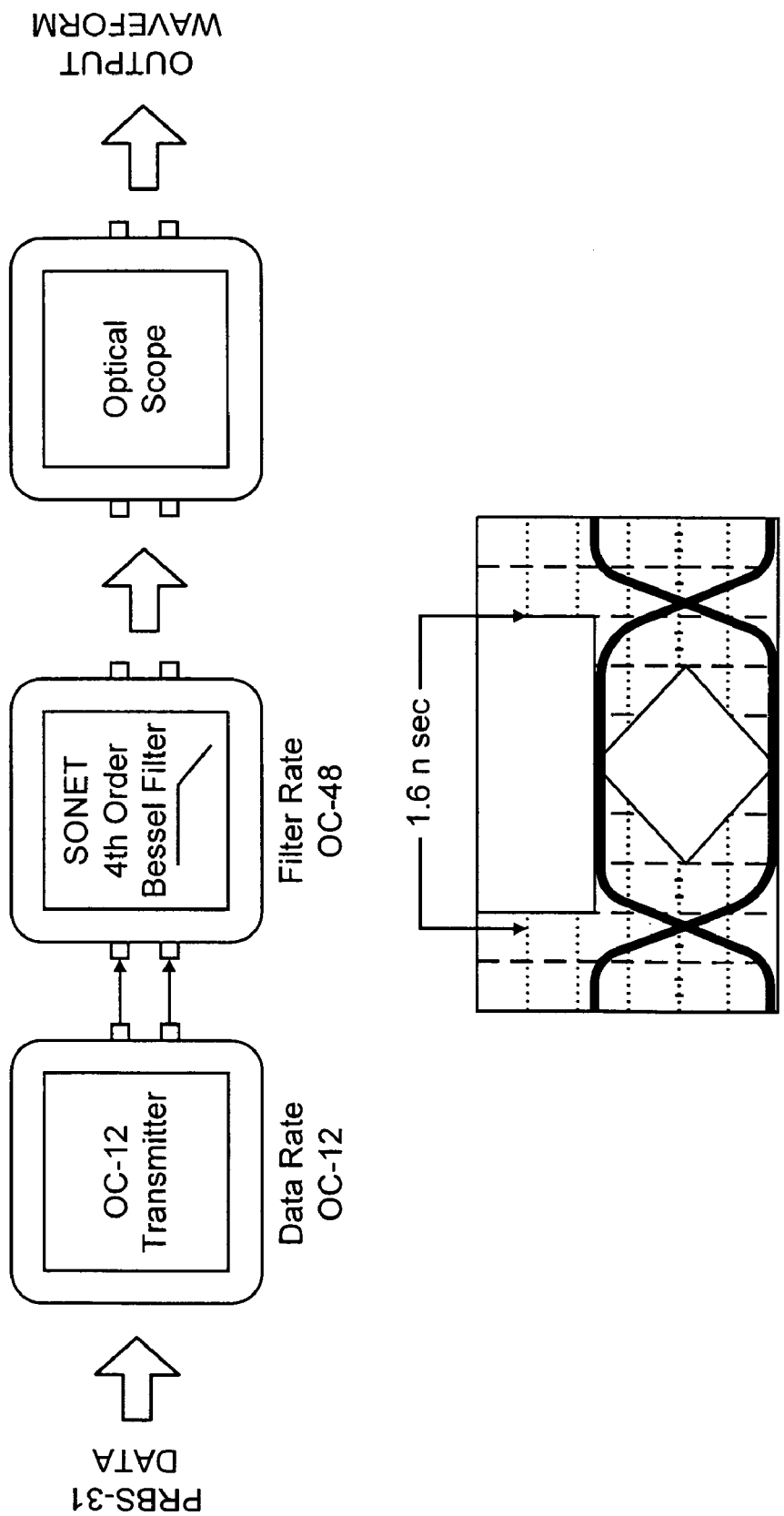
FIG. 2 is an exemplary illustration of eye pattern corruption that may occur in an eye pattern of a lower rate serial data signal when the lower rate serial data signal passes through a relatively wide-band filter stage.
Figure 3:
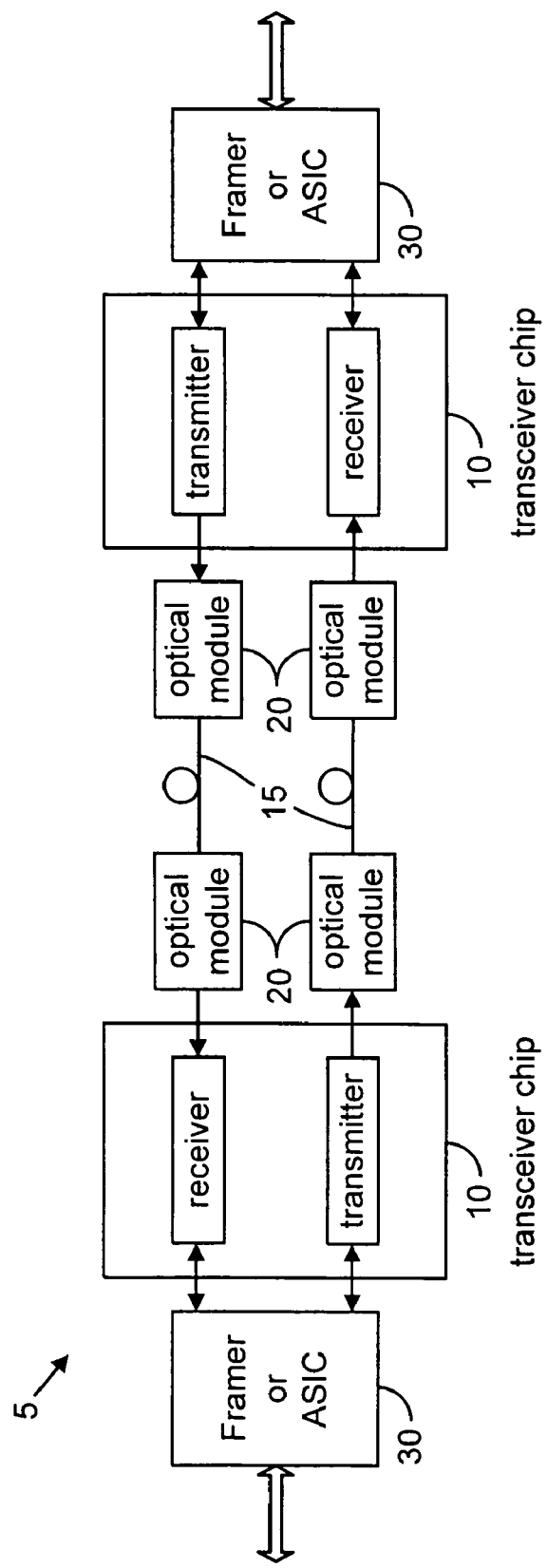
FIG. 3 is a schematic block diagram of part of an optical serial data communications system using a transceiver chip in accordance with an embodiment of the present invention.

FIG. 3 is a schematic block diagram of part of an optical serial data communications system 5 using transceiver chips 10 in accordance with an embodiment of the present invention. The communications system 5 shows optical fiber 15 linking optical modules 20. The optical modules transmit and receive optical serial data over the optical fiber 15 and convert the optical serial data to electrical serial data and vice versa.

The transceiver chips 10 interface to the optical modules 20 to transmit and receive electrical serial data to and from the optical modules 20. The transceiver chips 10 perform various communications functions including clock and data recovery (CDR), clock generation, data de-serialization and serialization, synchronization, data decoding and encoding, and transmission and reception of bit streams in accordance with an embodiment of the present invention. The transceiver chips 10 interface to a Framer or ASIC 30 to format, transmit, and receive digital data to and from the rest of the communications system 5.

Figure 4:
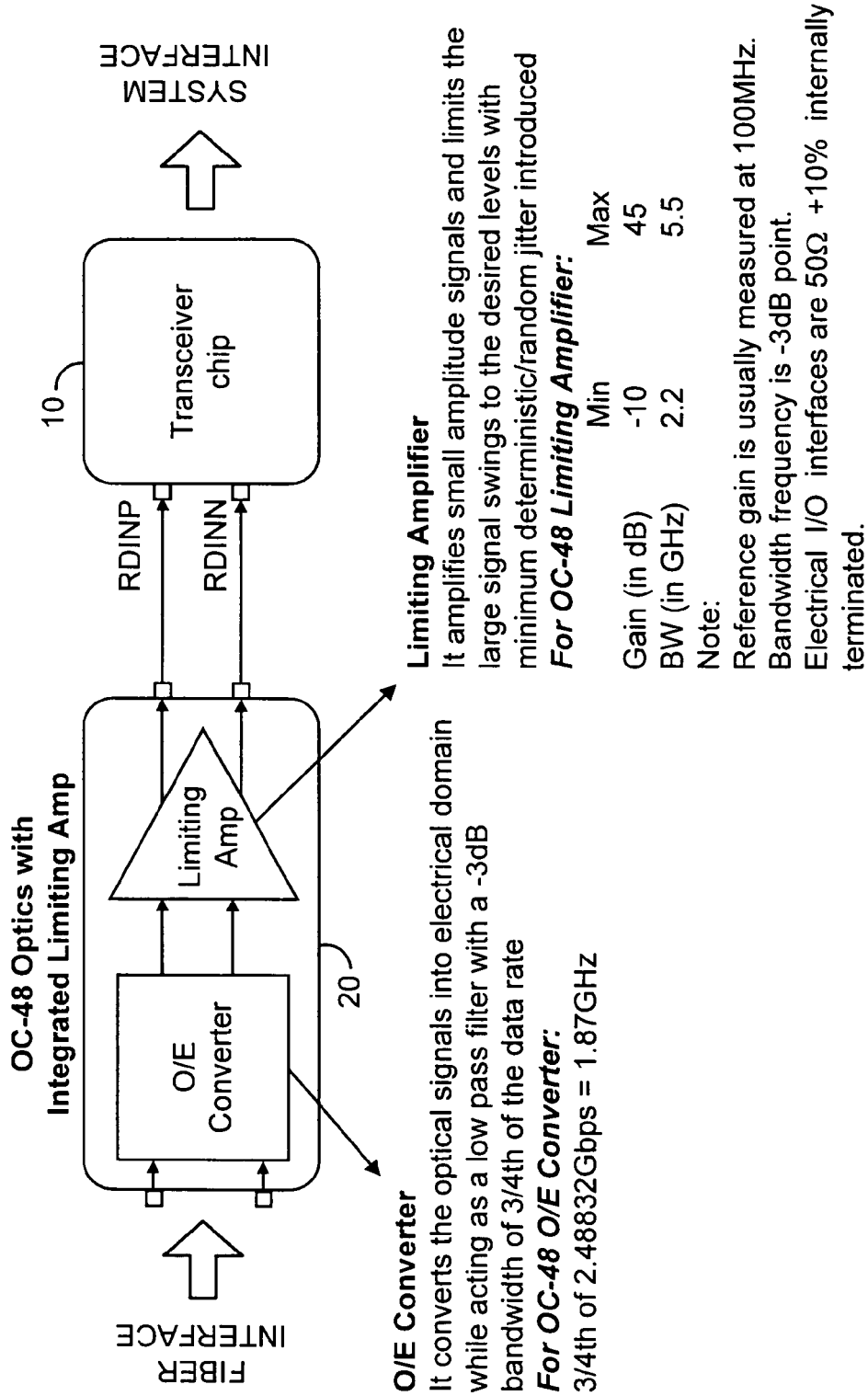
FIG. 4 is a schematic block diagram of an optical module and a transceiver chip of the optical serial data communications system of FIG. 3 in accordance with an embodiment of the present invention.

Referring to FIG. 4, in an embodiment of the present invention, the optical module 20 is an OC-48 optical module comprising an optical-to-electrical (O/E) converter 21 and a limiting amplifier 22. The O/E converter 21 converts the optical signals into electrical signals, acting as a low-pass filter with, for example, a −3 dB bandwidth of ¾ of the data rate. For example, for the OC-48 data rate of 2.488 Gbps, the −3 dB bandwidth would be 1.87 GHz.

The limiting amplifier 22 amplifies small amplitude signals and limits the large signal swings to the desired levels without introducing significant deterministic/random jitter. The limited electrical serial data is passed to the transceiver chip 10 for further processing.

Figure 5:
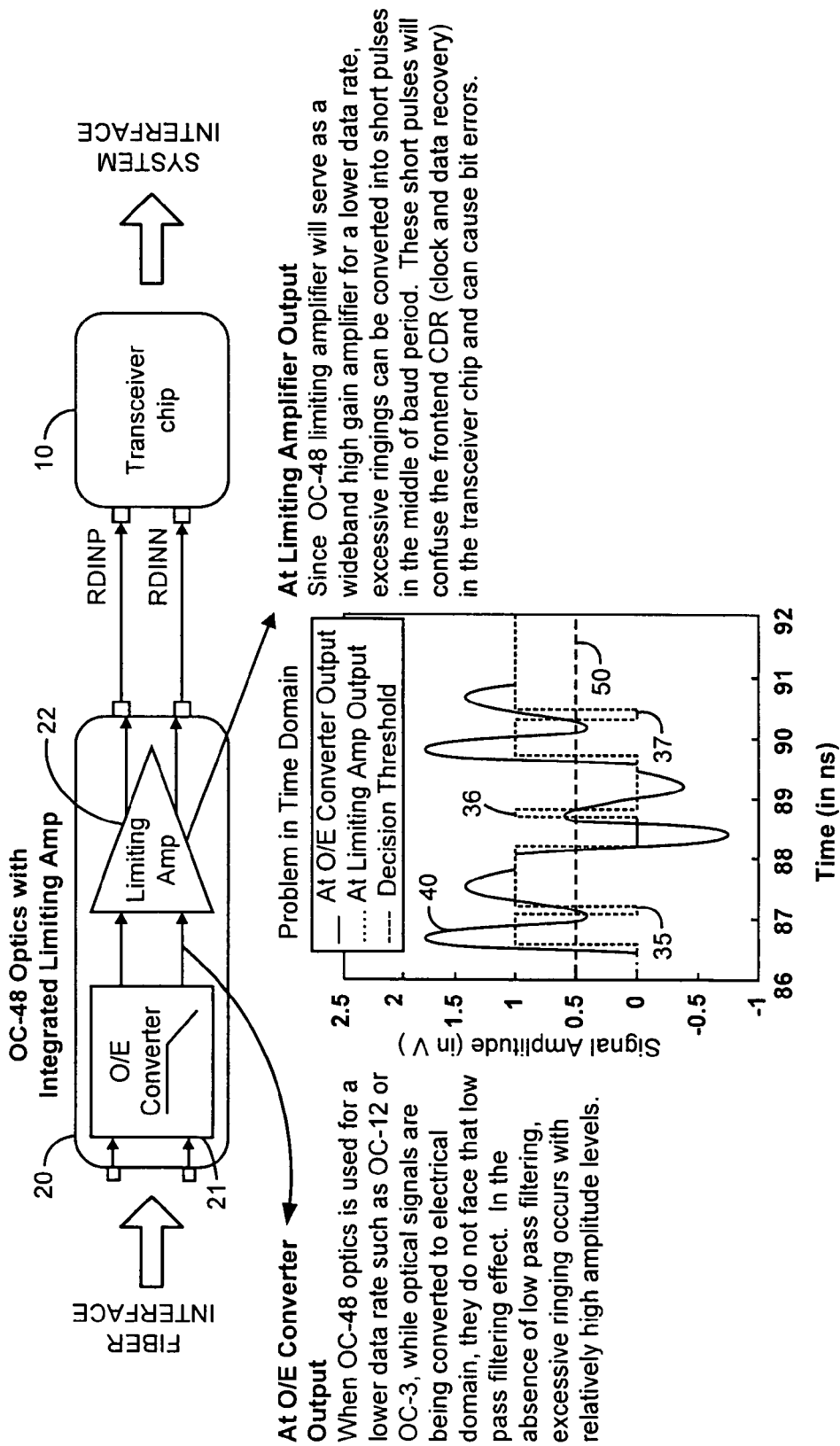
FIG. 5 is an exemplary illustration of signal ringing that may be inadvertently converted into short pulses in the middle of a baud period when a lower rate serial data signal passes through an optical module having a bandwidth that is much wider than the bandwidth of the lower rate serial data signal.

However, if lower data rate signals such as, for example, OC-3, OC-12, or 1 Gigabit Ethernet signals are received through the relatively wide-bandwidth OC-48 optical module 20, the resultant eye pattern out of the optical module 20 may be corrupted with ringing and/or closure of the eye pattern due to insufficient low-pass filtering by the O/E converter 21. In such a situation, short pulses 35, 36, 37 may occur in the middle of baud periods as shown in FIG. 5. The short pulses may confuse the clock and data recovery (CDR) circuit in the transceiver chip 10 and cause bit errors.

As shown in FIG. 5, if the signal 40 out of the O/E converter 21 has excessive ringing, then the ringings that cross a predetermined binary threshold 50 result in the short pulses 35, 36, 37 out of the limiting amplifier 22.

Figure 6:
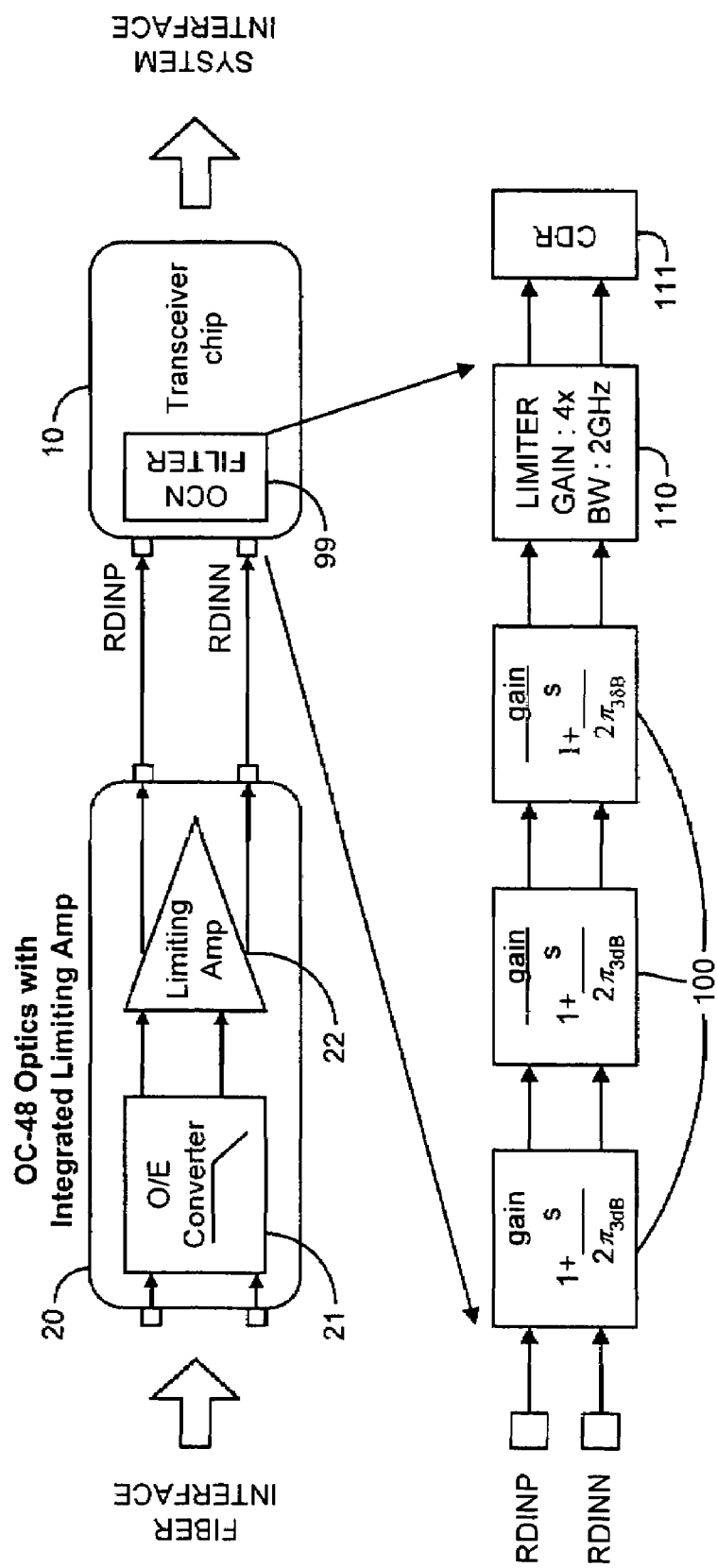
FIG. 6 is a schematic block diagram of a multi-rate filter implemented within a transceiver chip used in a serial data communications system in accordance with an embodiment of the present invention.

Referring to FIG. 6, in accordance with an embodiment of the present invention, the transceiver chip 10 incorporates a multi-rate OCN filter 99. The multi-rate OCN filter 99 is an adjustable low-pass filter. That is, the frequency response and, more particularly, the bandwidth of the low-pass filter may be selected or adjusted to correspond to the data rate of a current serial data signal being received. As a result, the unwanted short pulses in the signal out of the optical module 20 may be eliminated.

For example, for an OC-3 data rate, the −3 dB bandwidth of the OCN filter may be adjusted to be ¾ of the 155.52 Mbps data rate (i.e., 116.64 MHz) in an embodiment of the present invention. Other data rates may be handled by the OCN filter 99 as well in accordance with an embodiment of the present invention. For example, data rates corresponding to OC-3, OC-6, OC-12, 1 Gigabit Ethernet, and OC-48 may be handled in an embodiment of the present invention.

Figure 7:
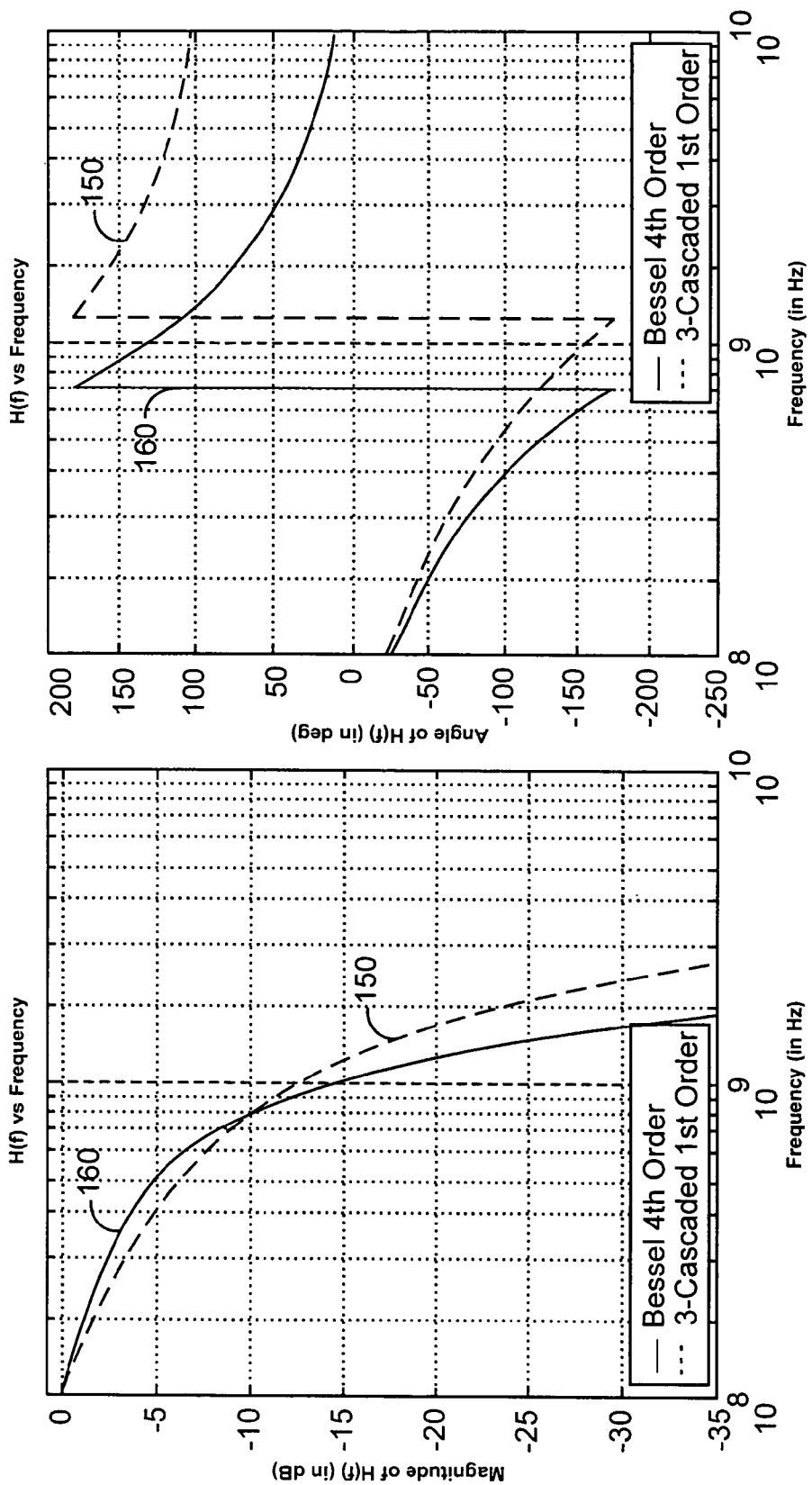
FIG. 7 is an exemplary illustration of a frequency response of a selected filter of the multi-rate filter of FIG. 6 in comparison to a fourth order Bessel-Thomson frequency response in accordance with an embodiment of the present invention.

In an embodiment of the present invention, the OCN filter 99 comprises three first-order filter stages 100 connected in series and followed by a limiter stage 110. The frequency response 150 of the combined three stages 100 approximates a $4^{th}$ order Bessel-Thompson filter frequency response 160 in accordance with an embodiment of the present invention as shown in FIG. 7. Using three first-order stages is easier to implement in the transceiver chip 10 than a single $4^{th}$ order stage. In alternative embodiments of the present invention, a different number of filter stages may be used instead of three.

In an embodiment of the present invention, the OCN filter 99 resides immediately after the high speed serial input buffers on the serial line side of the transceiver chip 10.

The limiter stage 110 converts the filtered serial data signal out of the three stages 100 to a full-swing serial data signal, similar to the function of the limiting amplifier 22 in the optical module 20.

In an embodiment of the present invention, each first order filter stage 100 provides a gain of approximately 2× and a –3 dB cutoff frequency of 1.2× bit rate. The limiter stage 110 provides a gain of approximately 4× and a –3 dB cutoff frequency of 2 GHz.

Figure 8:
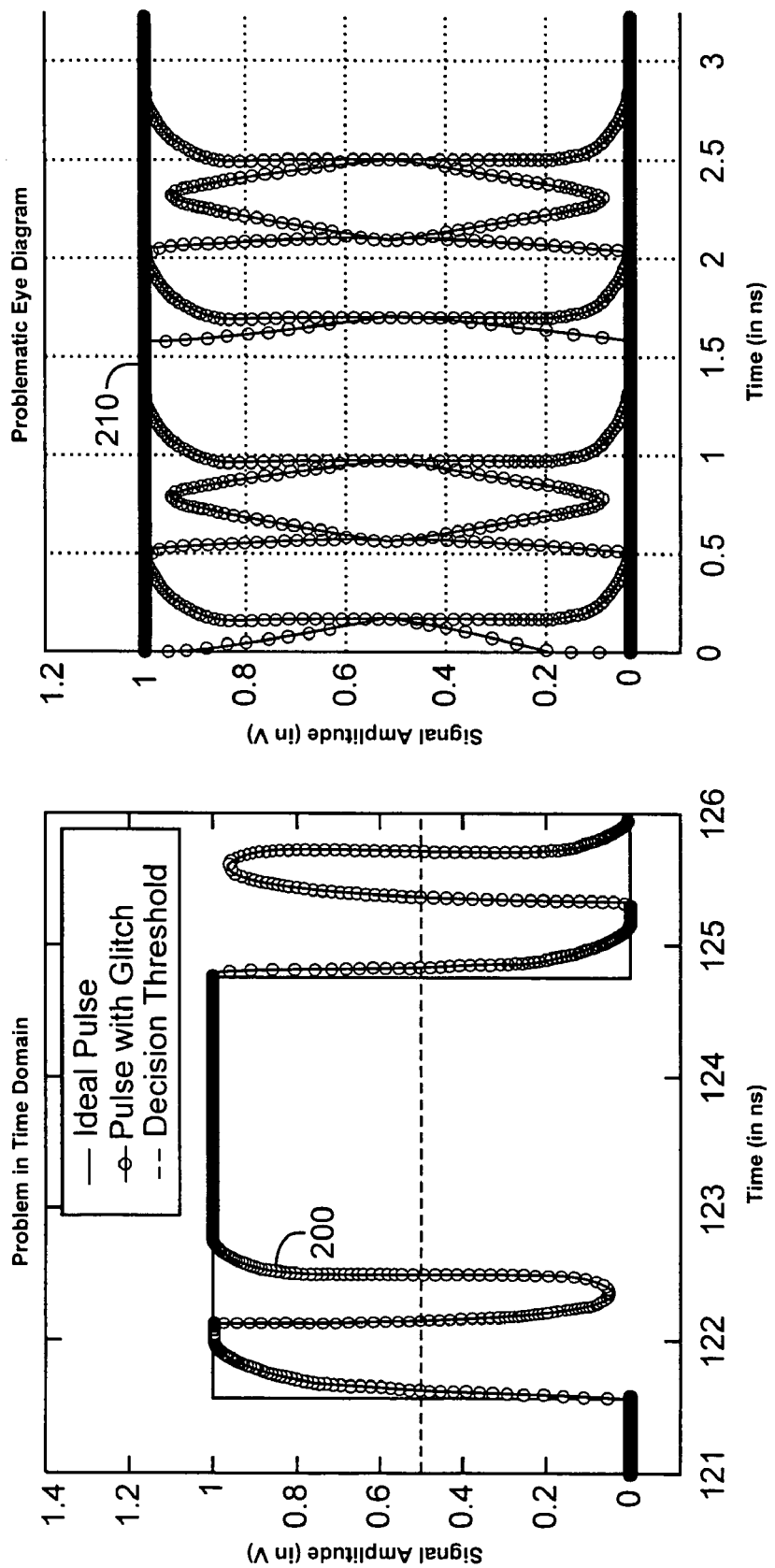
FIG. 8 is an exemplary illustration of a corrupted received serial data signal and resultant corrupted eye diagram.

FIG. 8 illustrates an example of a serial data signal 200 and corresponding eye pattern 210 out of the optical module 20 having unwanted ringing due to the difference in the bandwidth of the serial data signal 200 and the optical module 20.

Figure 9:
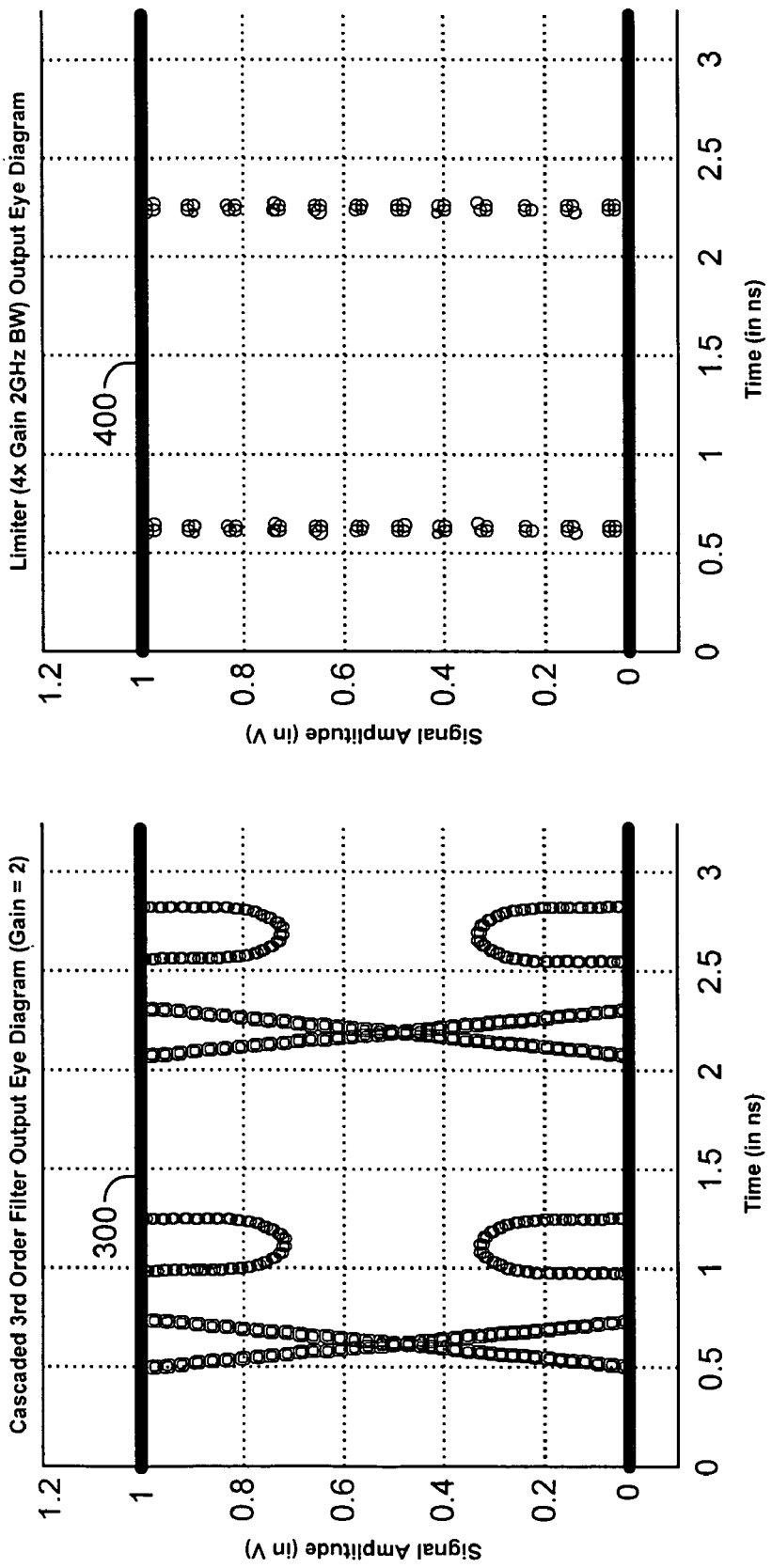
FIG. 9 is an exemplary illustration of eye diagrams of the received serial data signal of FIG. 8 after filtering and limiting the received serial data signal in accordance with an embodiment of the present invention.

FIG. 9 illustrates how the three stages 100 of the OCN filter 99 improves the eye pattern 200 to yield the eye pattern 300, and how the limiting stage 110 totally cleans up any residual ringing in the eye pattern 300 to yield the eye pattern 400. As a result, a lower data rate signal may be processed through a relatively wide-bandwidth optical module 20 and correctly recovered at the transceiver chip 10 using the adjustable OCN filter 99. Once the signal is correctly recovered by the OCN filter 99, the signal is passed to the CDR unit 111 within the transceiver chip 10 and all subsequent processing may proceed.

Figure 10:
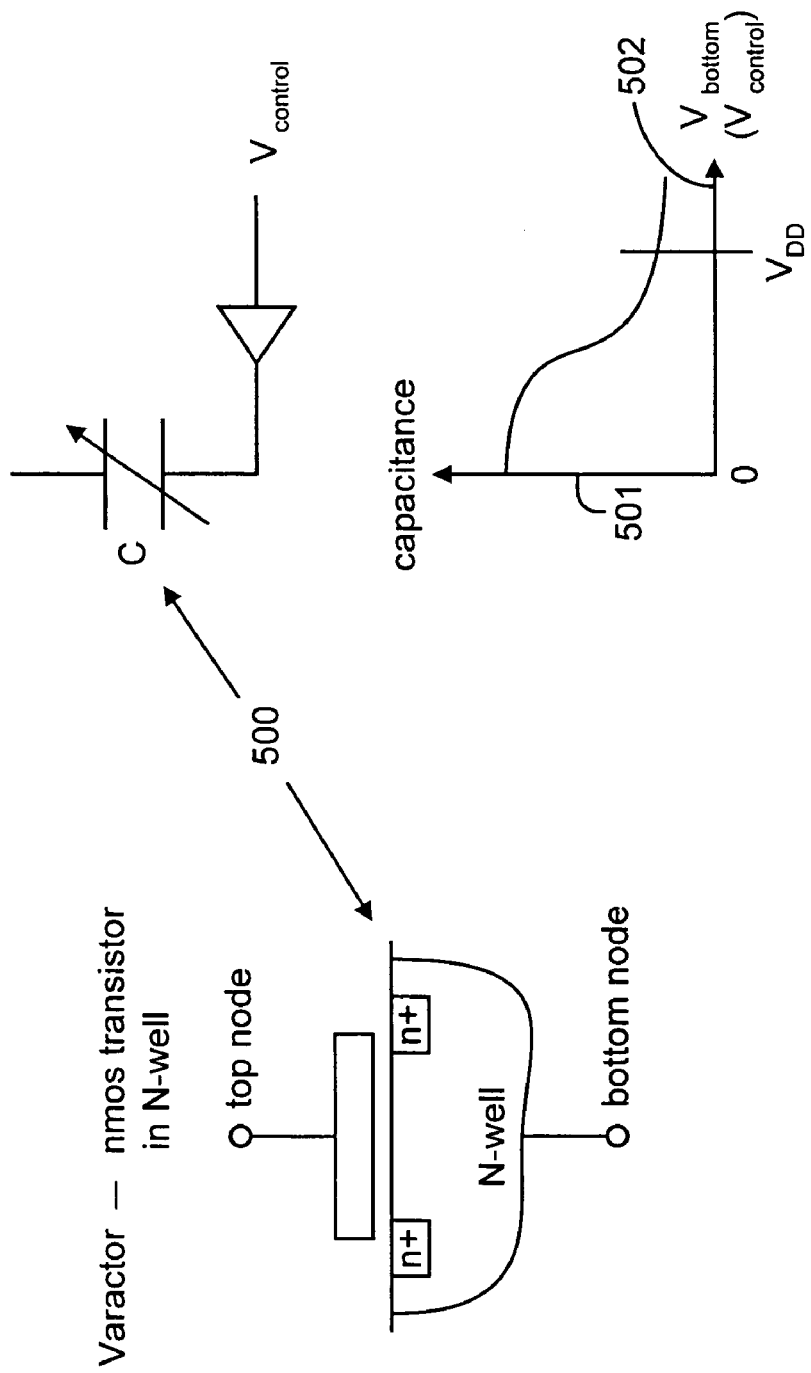
FIG. 10 is an exemplary illustration of a variable capacitor implemented as part of the multi-rate filter of FIG. 6 in accordance with an embodiment of the present invention.

In an embodiment of the present invention, each filter stage 100 may be implemented within the transceiver chip 10 using variable capacitors and variable resistors. Referring to FIG. 10, a variable capacitor 500 may be constructed within the OCN filter 99 of the transceiver chip 10 as an N-MOS transistor in an N-well, known as a varactor. By adjusting the voltage applied to the bottom node of the variable capacitor 500 ($V_{bottom}$ or $V_{control}$) 502, the capacitance value 501 may be changed and, therefore, the bandwidth (–3 db cutoff frequency) of the filter stage may be changed.

Figure 11:
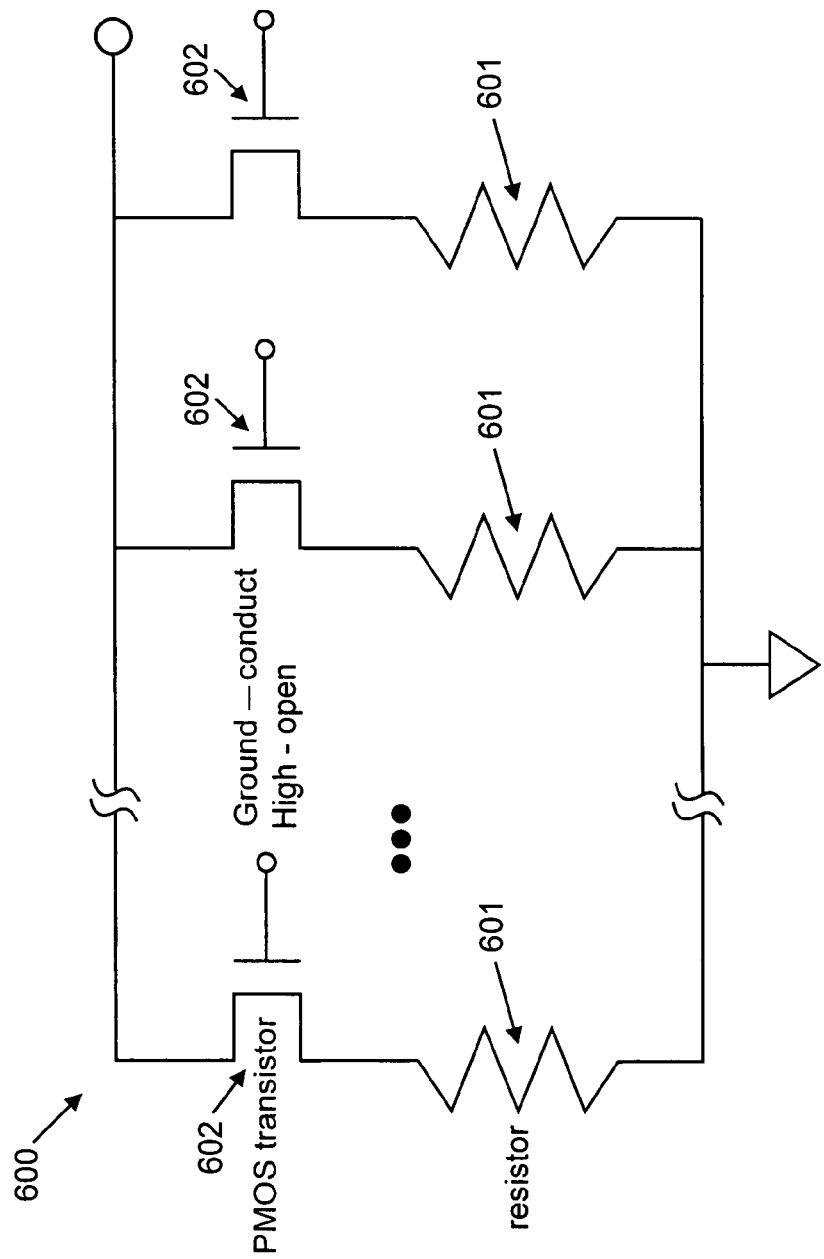
FIG. 11 is an exemplary illustration of a variable resistor implemented as part of the multi-rate filter of FIG. 6 in accordance with an embodiment of the present invention.

Referring to FIG. 11, a variable resistor 600 may be constructed within the OCN filter 99 of the transceiver chip 10 as a parallel bank of resistors 601 and P-MOS transistor switches 602 in accordance with an embodiment of the present invention. When a gate of a given P-MOS transistor 602 is grounded, that branch of the parallel bank conducts and lowers the overall resistance value of the parallel bank. When a gate of a given P-MOS transistor 602 is set to $V_{DD}$, that branch of the parallel bank is open and does not conduct, therefore, increasing the overall resistance value of the parallel bank. As a result, the bandwidth of the OCN filter may be changed.

Alternatively, in an embodiment of the present invention, N-MOS transistors may be used instead of P-MOS transistors such that, when a gate of an N-MOS transistor is switched to $V_{DD}$, that branch of the parallel bank conducts and lowers the overall resistance value of the parallel bank. When the gate is grounded, the branch is open and does not conduct, therefore, increasing the overall resistance value of the parallel bank.

In accordance with an embodiment of the present invention, the variable capacitor 500 and the variable resistor 600 may be configured to form one passive low-pass filter stage 100 of the OCN filter 99. Each stage 100 of the OCN filter 99 may be similarly configured to form a particular OCN filter having a frequency response approximating a $4^{th}$ order Bessel-Thompson function with a certain bandwidth.

As an alternative, the variable capacitor 500 may be implemented as a parallel bank of capacitors and N-MOS or P-MOS transistors similar to that of the parallel bank of resistors 600.

Figure 12:
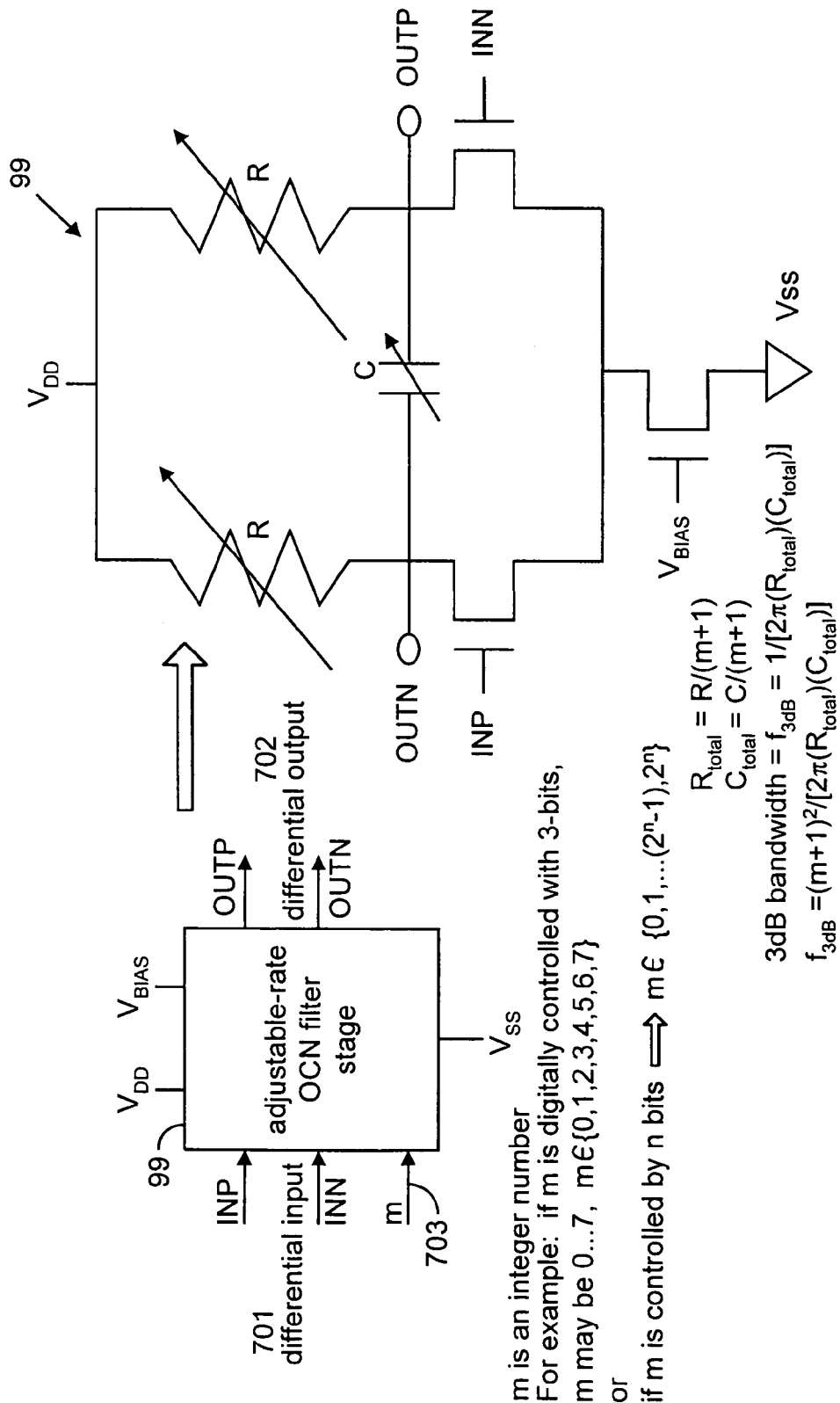
FIG. 12 is an exemplary block diagram and circuit illustration of the adjustable rate OCN filter stage in accordance with an embodiment of the present invention.

FIG. 12 illustrates an exemplary block diagram and circuit of an adjustable rate OCN filter stage in accordance with an embodiment of the present invention using variable resistors and variable capacitors and switching transistors. Serial data is passed into the filter 99 through a differential input 701 and filtered serial data is output through a differential output 702. In an embodiment of the present invention, the filter bandwidth is selectable based on a digital input m 703.

In an embodiment of the present invention, the OCN filter 99 may be preset to any of a number of standard data rates (e.g., OC-3, OC-12, 1 Gigabit Ethernet, and OC-48) by the customer of the communications system 5. In another embodiment of the present invention, the OCN filter 99 may be customized to a specific, non-standard bandwidth in order to optimize the serial data signal out of the filter. Bandwidth selection of the OCN filter 99 is accomplished through control pins of the transceiver chip 10 in accordance with an embodiment of the present invention.

In an embodiment of the present invention, a bandwidth of the OCN filter 99 may be actively calibrated to optimize a bit-error-ratio (BER) of a received serial data signal within the transceiver chip 10.

In an embodiment of the present invention, the OCN filter 99 in the transceiver chip 10 is implemented in CMOS technology.

In alternative embodiments of the present invention, the transceiver chip 10 may be integrated into an all-electrical (i.e., non-optical) communications system. Embodiments of the present invention are not limited to optical communication systems.

The various elements of the apparatus and method may be combined or separated according to various embodiments of the present invention. For example, the limiting stage 110 could be implemented as part of the CDR unit 111 instead of as part of the OCN filter 99. Also, as an alternative, the OCN filter 99 may be implemented in a receiver chip that does not have a transmitter in accordance with an embodiment of the present invention.

In summary, certain embodiments of the present invention afford an approach for receiving multi-rate serial data signals through wide-bandwidth communication network components such as a wide bandwidth optical module. A multi-rate filter is implemented in a transceiver chip such that the frequency response (i.e., bandwidth) of the multi-rate filter may be adjusted to correspond to the data rate of the received serial data signal from the network component.

While the invention has been described with reference to certain embodiments, it will be understood by those skilled in the art that various changes may be made and equivalents may be substituted without departing from the scope of the invention. In addition, many modifications may be made to adapt a particular situation or material to the teachings of the invention without departing from its scope. Therefore, it is intended that the invention not be limited to the particular embodiment disclosed, but that the invention will include all embodiments falling within the scope of the appended claims.

What is claimed is:

1. In a transceiver chip used in high-speed serial data communications, apparatus to aid said transceiver chip in receiving data at multiple data rates, said apparatus comprising:

at least one multi-rate filter stage within said transceiver chip to generate a filtered serial data signal from a received serial data signal; and a limiter stage within said transceiver chip to generate a full-swing serial data signal from said filtered serial data signal, said at least one multi-rate rate filter stage comprises at least one passive R-C circuit within said transceiver chip, wherein a capacitance value of said at least one passive R-C circuit is determined by a variable capacitor implemented within said transceiver chip as an N-MOS transistor in an N-well.

2. The apparatus of claim 1 wherein a bandwidth of said at least one multi-rate filter stage is adjustable in order to receive serial data signals at multiple data rates.

3. The apparatus of claim 1 wherein said at least one multi-rate filter stage comprises three first-order filter stages connected in series within said transceiver chip.

4. The apparatus of claim 1 wherein said at least one multi-rate filter stage comprises a low-pass filter within said transceiver chip.

5. The apparatus of claim 1 wherein said at least one multi-rate filter stage and said limiter stage eliminate ringing, of said received serial data signal, due to overshoot and undershoot of a predetermined signal threshold level by said serial data signal.

6. The apparatus of claim 1 wherein said N-MOS transistor comprises a varactor.

7. In a transceiver chip used in high-speed serial data communications, apparatus to aid said transceiver chip in receiving data at multiple data rates, said apparatus comprising:

at least one multi-rate filter stage within said transceiver chip to generate a filtered serial data signal from a received serial data signal; and a limiter stage within said transceiver chip to generate a full-swing serial data signal from said filtered serial data signal, said at least one multi-rate rate filter stage comprises at least one passive R-C circuit within said transceiver chip, wherein a capacitance value of said at least one passive R-C circuit is determined by a variable capacitor implemented within said transceiver chip as parallel bank of capacitors and P-MOS and/or N-MOS transistors that are switched to ground and/or $V_{DD}$.

8. The apparatus of claim 7 wherein a bandwidth of said at least one multi-rate filter stage is adjustable in order to receive serial data signals at multiple data rates.

9. The apparatus of claim 7 wherein said at least one multi-rate filter stage comprises three first-order filter stages connected in series within said transceiver chip.

10. The apparatus of claim 7 wherein said at least one multi-rate filter stage comprises a low-pass filter within said transceiver chip.

11. The apparatus of claim 7 wherein said at least one multi-rate filter stage and said limiter stage eliminate ringing, of said received serial data signal, due to overshoot and undershoot of a predetermined signal threshold level by said serial data signal.

12. In a transceiver chip used in high-speed serial data communications, apparatus to aid said transceiver chip in receiving data at multiple data rates, said apparatus comprising:

at least one multi-rate filter stage within said transceiver chip to generate a filtered serial data signal from a received serial data signal; and a limiter stage within said transceiver chip to generate a full-swing serial data signal from said filtered serial data signal, said at least one multi-rate rate filter stage comprises at least one passive R-C circuit within said transceiver chip, wherein a resistance value of said at least one passive R-C circuit is determined by a variable resistor implemented within said transceiver chip as a parallel bank of resistors and P-MOS and/or N-MOS transistors that are switched to ground and/or $V_{DD}$.

13. The apparatus of claim 12 wherein a bandwidth of said at least one multi-rate filter stage is adjustable in order to receive serial data signals at multiple data rates.

14. The apparatus of claim 12 wherein said at least one multi-rate filter stage comprises three first-order filter stages connected in series within said transceiver chip.

15. The apparatus of claim 12 wherein said at least one multi-rate filter stage comprises a low-pass filter within said transceiver chip.

16. The apparatus of claim 12 wherein said at least one multi-rate filter stage and said limiter stage eliminate ringing, of said received serial data signal, due to overshoot and undershoot of a predetermined signal threshold level by said serial data signal.

17. In a transceiver chip used in high-speed serial data communications, a method to aid said transceiver chip in receiving data at multiple data rates, said method comprising:

generating a filtered serial data signal from a received serial data signal by at least one multi-rate filter stage within said transceiver chip; and generating a full-swing serial data signal from said filtered serial data signal by a limiter stage within said transceiver chip, said at least one multi-rate rate filter stage comprising at least one passive R-C circuit within said transceiver chip, wherein a capacitance value of said at least one passive R-C circuit is determined by a variable capacitor implemented within said transceiver chip as a parallel bank of capacitors and P-MOS and/or N-MOS transistors that are switched to ground and/or $V_{DD}$.

18. The method of claim 17 wherein a bandwidth of said at least one multi-rate filter stage is adjustable in order to receive serial data signals at multiple data rates.

19. The method of claim 17 wherein said at least one multi-rate filter stage comprises three first-order filter stages connected in series within said transceiver chip.

20. The method of claim 17 wherein said at least one multi-rate filter stage comprises a low-pass filter within said transceiver chip.

21. The method of claim 17 wherein said at least one multi-rate filter stage and said limiter stage eliminate ringing, of said received serial data signal, due to overshoot and undershoot of a predetermined signal threshold level by said serial data signal.

22. In a transceiver chip used in high-speed serial data communications, a method to aid said transceiver chip in receiving data at multiple data rates, said method comprising:

generating a filtered serial data signal from a received serial data signal by at least one multi-rate filter stage within said transceiver chip; and generating a full-swing serial data signal from said filtered serial data signal by a limiter stage within said transceiver chip, said at least one multi-rate rate filter stage comprising at least one passive R-C circuit within said transceiver chip, wherein a resistance value of said at least one passive R-C circuit is determined by a variable resistor implemented within said transceiver chip as a parallel bank of resistors and P-MOS and/or N-MOS transistors that are switched to ground and/or $V_{DD}$.

23. The method of claim 22 wherein a bandwidth of said at least one multi-rate filter stage is adjustable in order to receive serial data signals at multiple data rates.

24. The method of claim 22 wherein said at least one multi-rate filter stage comprises three first-order filter stages connected in series within said transceiver chip.

25. The method of claim 22 wherein said at least one multi-rate filter stage comprises a low-pass filter within said transceiver chip.

26. The method of claim 22 wherein said at least one multi-rate filter stage and said limiter stage eliminate ringing, of said received serial data signal, due to overshoot and undershoot of a predetermined signal threshold level by said serial data signal.

* * * * *